(12) United States Patent
Xu

(10) Patent No.: US 9,209,035 B2
(45) Date of Patent: *Dec. 8, 2015

(54) PHOTORESIST PATTERN TRIMMING METHODS

(71) Applicant: Rohm and Haas Electronic Materials LLC, Marlborough, MA (US)

(72) Inventor: Cheng-Bai Xu, Southborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 53 days.

This patent is subject to a terminal disclaimer.

(21) Appl. No.: 13/731,886

(22) Filed: Dec. 31, 2012

(65) Prior Publication Data

US 2013/0171825 A1 Jul. 4, 2013

Related U.S. Application Data

(60) Provisional application No. 61/582,289, filed on Dec. 31, 2011.

(51) Int. Cl.
| | |
|---|---|
| H01L 21/308 | (2006.01) |
| H01L 21/027 | (2006.01) |
| G03F 7/039 | (2006.01) |
| G03F 7/40 | (2006.01) |

(52) U.S. Cl.
CPC ............ *H01L 21/308* (2013.01); *G03F 7/0392* (2013.01); *G03F 7/405* (2013.01); *H01L 21/0274* (2013.01)

(58) Field of Classification Search
CPC ..... H01L 21/308; H01L 21/3088; G03F 7/26; G03F 7/40; G03F 7/168
USPC .................................. 438/694, 708, 717, 725
See application file for complete search history.

(56) References Cited

U.S. PATENT DOCUMENTS

| | | |
|---|---|---|
| 6,180,230 B1 | 1/2001 | Saito et al. |
| 7,338,750 B2 | 3/2008 | Kozawa et al. |
| 7,862,982 B2 | 1/2011 | Burns et al. |

(Continued)

FOREIGN PATENT DOCUMENTS

| | | |
|---|---|---|
| CN | 1531018 A | 9/2004 |
| JP | 2002-006512 A1 | 1/2002 |

(Continued)

OTHER PUBLICATIONS

Search report of corresponding Chinese Application No. 201210599256.X, Apr. 17, 2015.

*Primary Examiner* — Binh X Tran
(74) *Attorney, Agent, or Firm* — Jonathan D. Baskin

(57) ABSTRACT

Provided are methods of trimming photoresist patterns. The methods involve coating a photoresist trimming composition over a photoresist pattern, wherein the trimming composition includes a matrix polymer, a thermal acid generator and a solvent, the trimming composition being free of cross-linking agents. The coated semiconductor substrate is heated to generate an acid in the trimming composition from the thermal acid generator, thereby causing a change in polarity of the matrix polymer in a surface region of the photoresist pattern. The photoresist pattern is contacted with a developing solution to remove the surface region of the photoresist pattern. The methods find particular applicability in the formation of very fine lithographic features in the manufacture of semiconductor devices.

18 Claims, 1 Drawing Sheet

(56) References Cited

U.S. PATENT DOCUMENTS

| | | |
|---|---|---|
| 8,067,148 B2 | 11/2011 | Endou et al. |
| 2003/0017711 A1 | 1/2003 | Mahorowala et al. |
| 2006/0211814 A1 | 9/2006 | Nishikawa et al. |
| 2006/0257749 A1 | 11/2006 | Chang et al. |
| 2006/0263728 A1 | 11/2006 | Shinbori et al. |
| 2008/0122125 A1* | 5/2008 | Zhou ............................ 257/797 |
| 2009/0146322 A1 | 6/2009 | Welling et al. |
| 2009/0311490 A1* | 12/2009 | Burns et al. ................ 428/195.1 |
| 2011/0147985 A1* | 6/2011 | Cheng et al. .................. 264/225 |
| 2011/0174774 A1 | 7/2011 | Lin et al. |

FOREIGN PATENT DOCUMENTS

| | | |
|---|---|---|
| JP | 2002-299202 A1 | 10/2002 |
| JP | 4329216 B2 | 9/2009 |

\* cited by examiner

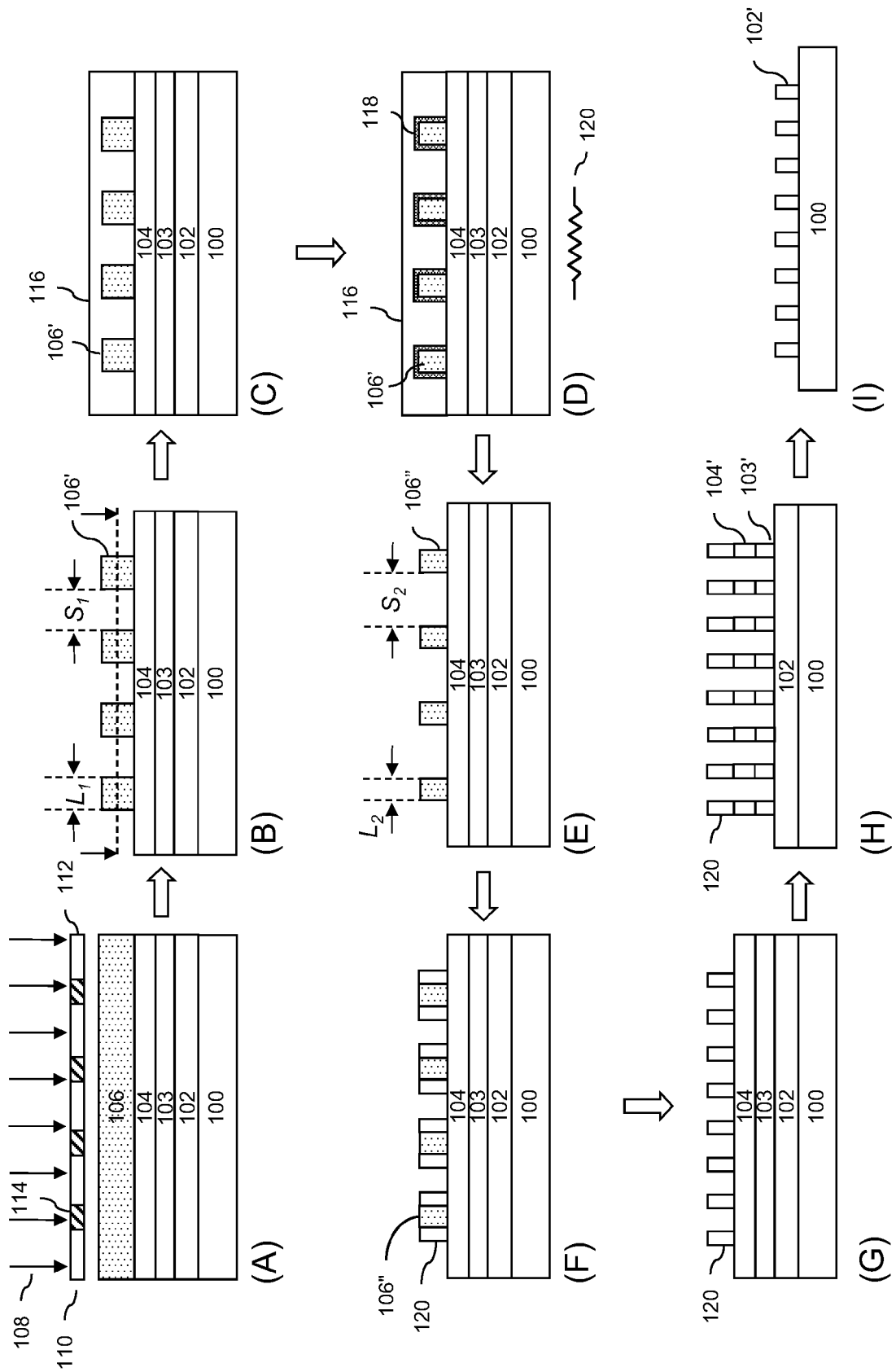

PHOTORESIST PATTERN TRIMMING METHODS

This application claims the benefit of priority under 35 U.S.C. §119(e) to U.S. Provisional Application No. 61/582,289, filed Dec. 31, 2011, the entire contents of which are incorporated herein by reference.

BACKGROUND

The invention relates generally to the manufacture of electronic devices. More specifically, this invention relates to methods of trimming photoresist patterns useful in shrink processes for the formation of fine lithographic patterns.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Exposure to actinic radiation causes the acid generator to form an acid which, during post-exposure baking, causes cleavage of the acid-labile groups in the resin. This creates a difference in solubility characteristics between exposed and unexposed regions of the resist in an aqueous alkaline developer solution. Exposed regions of the resist are soluble in the aqueous alkaline developer and are removed from the substrate surface, whereas unexposed regions, which are insoluble in the developer, remain after development to form a positive image.

One approach to achieving nm-scale feature sizes in semiconductor devices is the use of short wavelengths of light, for example, 193 nm or less, during exposure of chemically amplified photoresists. To further improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium. When using water as the immersion fluid, the maximum numerical aperture can be increased, for example, from 1.2 to 1.35. With such an increase in numerical aperture, it is possible to achieve a 40 nm half-pitch resolution in a single exposure process, thus allowing for improved design shrink. This standard immersion lithography process, however, is generally not suitable for manufacture of devices requiring greater resolution, for example, for the 32 nm and 22 nm half-pitch nodes.

Considerable effort has been made to extend the practical resolution beyond that achieved with standard photolithographic techniques from both a materials and processing standpoint. For example, multiple patterning processes have been proposed for printing CDs and pitches beyond lower resolution limits of conventional lithographic tools. One such multiple patterning process is self-aligned double patterning (SADP), described for example in U.S. Patent Application Pub. No. 2009/0146322A1. In this process, a spacer layer is formed over pre-patterned lines. This is followed by etching to remove all spacer layer material on horizontal surfaces of the lines and spaces, leaving behind only material on the sidewalls of the lines. The original patterned lines are then etched away, leaving behind the sidewall spacers which are used as a mask for etching one or more underlying layers. Since there are two spacers for every line, the line density is effectively doubled.

For multiple patterning and other lithographic processes, the printing of isolated lines and posts having a duty ratio greater than two with a good process window is essential at the lithography stage. Achieving a good process window for isolated lines and posts through direct lithographic imaging is, however, extremely difficult due to poor aerial image contrast at defocus as compared with dense lines.

There is a continuing need in the art for improved photolithographic methods for the formation of fine patterns in electronic device fabrication and which avoid or conspicuously ameliorate one or more of the foregoing problems associated with the state of the art.

SUMMARY OF THE INVENTION

In accordance with an aspect of the invention, methods of trimming photoresist patterns are provided. The methods comprise, in sequence: (a) providing a semiconductor substrate comprising one or more layers to be patterned on an upper surface thereof; (b) forming a photoresist pattern on the one or more layers to be patterned, wherein the photoresist pattern comprises a plurality of features and is formed from a chemically amplified photoresist composition, the photoresist pattern comprising a matrix polymer having acid labile groups; (c) coating a photoresist trimming composition over the photoresist pattern, wherein the trimming composition comprises a matrix polymer, a thermal acid generator and a solvent, and wherein the trimming composition is free of cross-linking agents; (d) heating the coated semiconductor substrate to generate an acid in the trimming composition from the thermal acid generator, thereby causing a change in polarity of the photoresist matrix polymer in a surface region of the photoresist pattern; and (e) contacting the photoresist pattern with a developing solution to remove the surface region of the photoresist pattern. As a result of methods in accordance with the invention, the process window for formation of patterns such as isolated lines and posts can be significantly improved.

In accordance with a further aspect of the invention, also provided are electronic devices formed by the methods described herein.

As used herein: "g" means grams; wt % means weight percent; "nm" means nanometer; "s" means second; "min" means minute; "Å" means Angstrom; "mol %" means mole percent; "Mw" means weight average molecular weight; "copolymer" is inclusive of polymers containing two or more different types of polymerized units; "alkyl" is inclusive of linear, branched and cyclic alkyl structures; "aliphatic" is inclusive of linear, branched and cyclic aliphatic structures; and the articles "a" and "an" are inclusive of one or more.

DESCRIPTION OF THE DRAWINGS

The present invention will be described with reference to the following drawing, in which like reference numerals denote like features, and in which:

FIG. 1A-I illustrates a process flow for forming a photolithographic pattern in accordance with the invention.

DETAILED DESCRIPTION

Photoresist Trimming Compositions

The photoresist trimming compositions include a matrix polymer, a thermal acid generator and a solvent, and can include optional additional components. When coated over a photoresist pattern formed from a chemically amplified photoresist composition, the photoresist trimming compositions can provide various benefits such as controllably reduced resist pattern dimensions and improved process window for the formation of isolated patterns such as isolated lines and posts.

The matrix polymer allows for the compositions to be coated over the photoresist pattern in the form of a layer having a desired thickness. This will help to ensure the presence of a sufficient content of thermal acid generator for interaction with the photoresist pattern surface.

The matrix polymer should have good solubility in the developer solution to be used in the trimming process. For example, the matrix polymer can be soluble in an aqueous alkaline developer, preferably aqueous quaternary ammonium hydroxide solutions such as aqueous tetramethylammonium hydroxide, or in water. To minimize residue defects originated from the overcoat materials, the dissolution rate of a dried layer of the trimming composition should be greater than that of the photoresist pattern surface region to be removed by the developer solution. The matrix polymer typically exhibits a developer dissolution rate of 100 Å/second or higher, preferably 1000 Å/second or higher. The matrix polymer is soluble in the solvent of the trimming composition, described herein. The matrix polymer can be chosen, for example, from polyvinyl alcohols, polyacrylic acids, polyvinyl pyrrolidones, polyvinyl amines, polyvinyl acetals, poly(meth)acrylates and combinations thereof. Preferably, the polymer contains one or more functional group chosen from —OH, —COOH, —SO$_3$H, SiOH, hydroxyl styrene, hydroxyl naphthalene, sulfonamide, hexafluoroisopropyl alcohol, anhydrates, lactones, esters, ethers, allylamine, pyrrolidones and combinations thereof.

The content of the matrix polymer in the composition will depend, for example, on the target thickness of the layer, with a higher polymer content being used for thicker layers. The matrix polymer is typically present in the compositions in an amount of from 80 to 99 wt %, more typically from 90 to 98 wt %, based on total solids of the trimming composition. The weight average molecular weight of the polymer is typically less than 400,000, preferably from 3000 to 50,000, more preferably from 3000 to 25,000.

Polymers useful in the overcoat compositions can be homopolymers or can be copolymers having a plurality of distinct repeat units, for example, two, three or four distinct repeat units. The trimming compositions typically include a single polymer, but can optionally include one or more additional polymer. Suitable polymers and monomers for use in the overcoat compositions are commercially available and/or can readily be made by persons skilled in the art.

The trimming compositions further include one or more thermal acid generator (TAG). In the case of a photoresist based on deprotection reaction, the TAG with heat generates an acid which can cleave the bond of acid labile groups in the photoresist pattern. Preferably, the generated acid is a strong acid such as sulfonic acid, and can be aromatic or non-aromatic. Preferably, the generated non-aromatic acids have at least one fluorine substituent at the alpha position of the acid group. Suitable TAGs can be activated at a temperature greater than 50° C., for example, greater than 70° C., greater than 90° C., greater than 120° C. or greater than 150° C. Suitable TAGs are chosen from those which generate aromatic or non-aromatic acids, with or without fluorine substitution. Examples of suitable thermal acid generators include nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, trifluoromethylbenzenesulfonic acid, perfluorobutane sulfonic acid; and particular onium salts. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Typically, the TAG will have a very low volatility at temperatures between 170 and 220° C. Examples of TAGs include those sold by King Industries, Norwalk, Conn. USA under NACURE™, CDX™ and K-PURE™ names, for example, NACURE 5225, CDX-2168E, K-PURE™ 2678 and K-PURE™ 2700. The thermally-sensitive component is typically present in the composition in an amount of from about 0.1 to 20 wt % based on the total solids of the trimming composition.

Preferable thermal acid generators for use in the trimming compositions include the following:

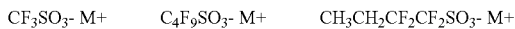
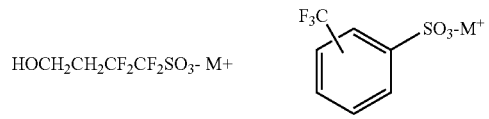
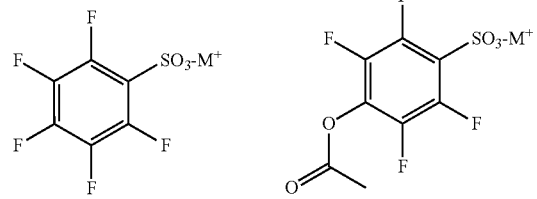
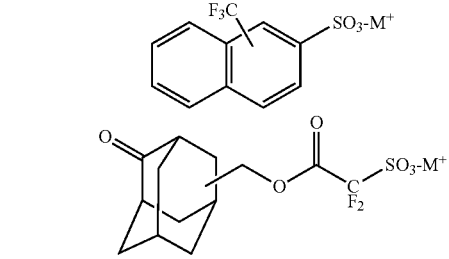
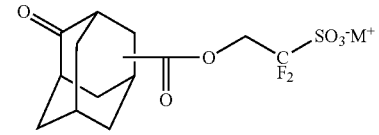
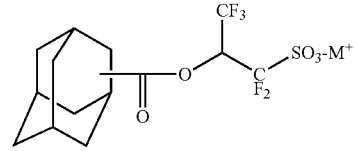

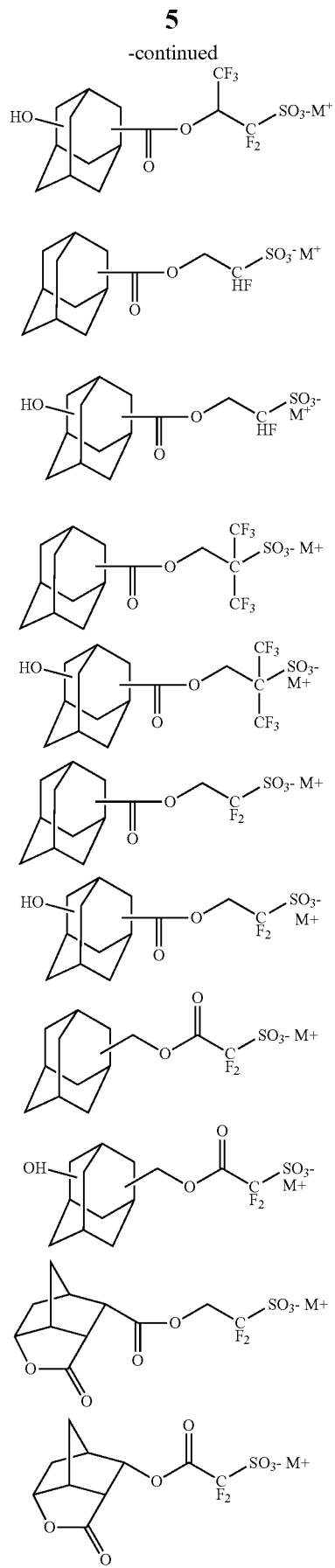
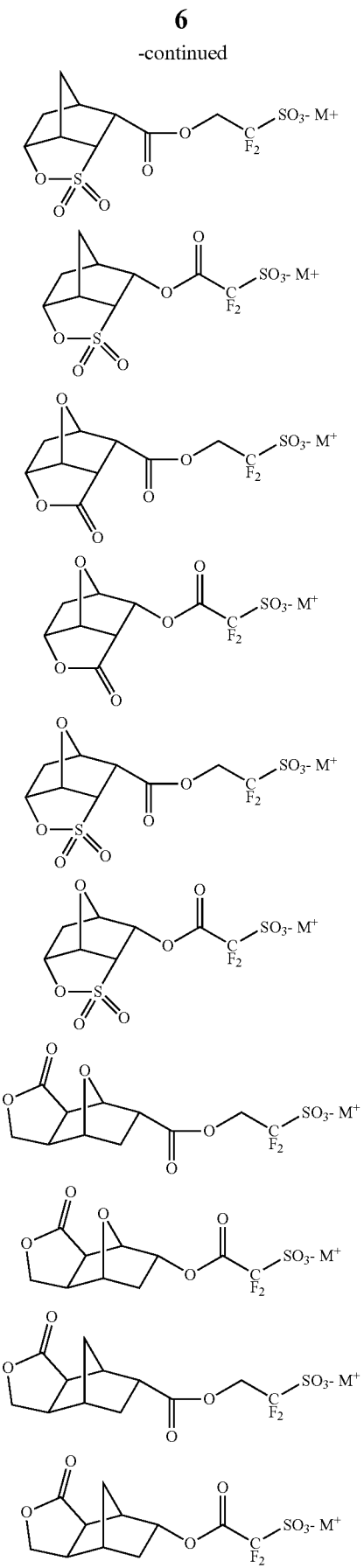

-continued

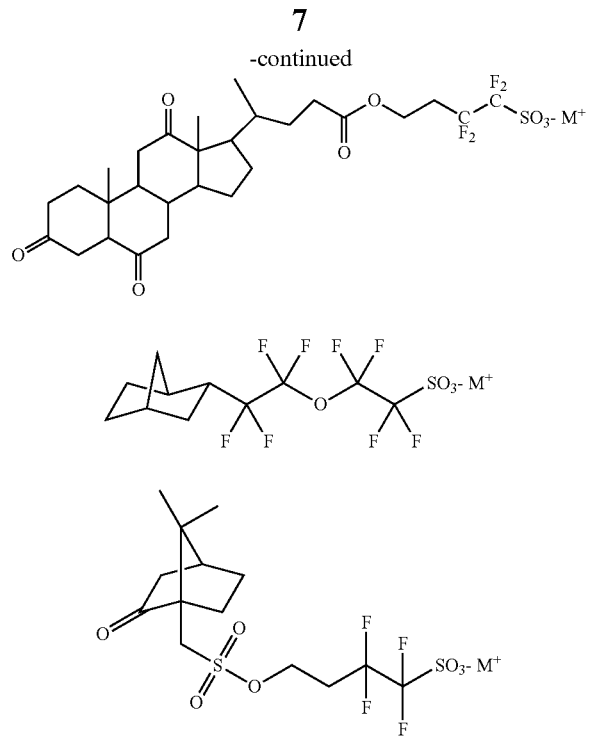

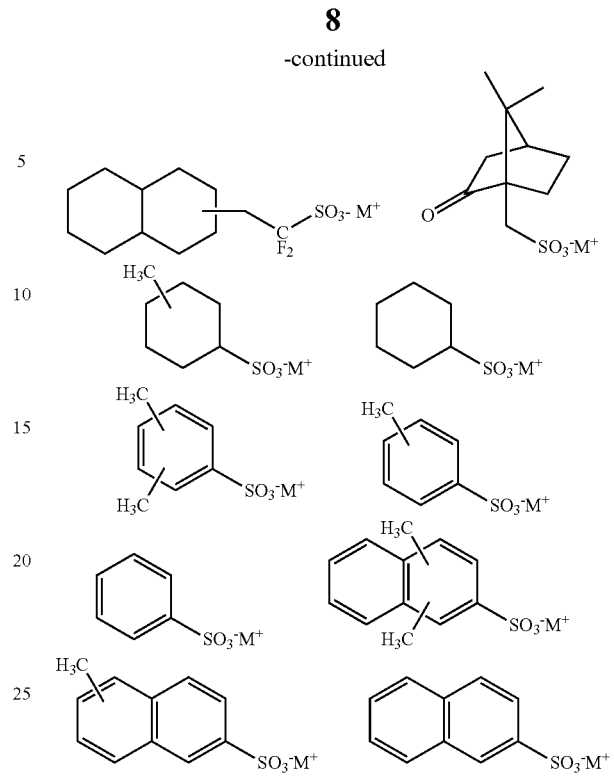

wherein M+ is an organic cation, preferably an organic cation chosen from the following general formulae I-IV:

$$\underset{R_2}{\overset{R_1}{\underset{|}{N}}}\underset{R_3}{H^+} \quad (I)$$

wherein $R_1$, $R_2$ and $R_3$ are each independently chosen from hydrogen and organic groups such as alkyl and phenyl, preferably, C1 to C5 alkyl with optional fluorine substitution, preferable such cations including, for example, $NH_4+$, $CF_3CH_2NH_3+$, $(CH_3)_3NH+$, $(C_2H_5)_3NH+$ and $(CH_3)_2(C_2H_5)NH+$;

$$R_4-S^+\!\!\!\bigcirc\!\!\!(CH2)_n \quad (II)$$

wherein: R4 is chosen from hydrogen and organic groups such as alkyl and aryl, preferably C1 to C5 alkyl with optional fluorine substitution or phenyl; and n is an integer of from 3 to 12, preferably 5 or 6;

$$R_5-\underset{R_7}{\overset{R_6}{\underset{|}{S^+}}} \quad (III)$$

wherein: $R_5$, $R_6$ and $R_7$ are independently chosen from hydrogen and organic groups such as alkyl and aryl, preferably C1

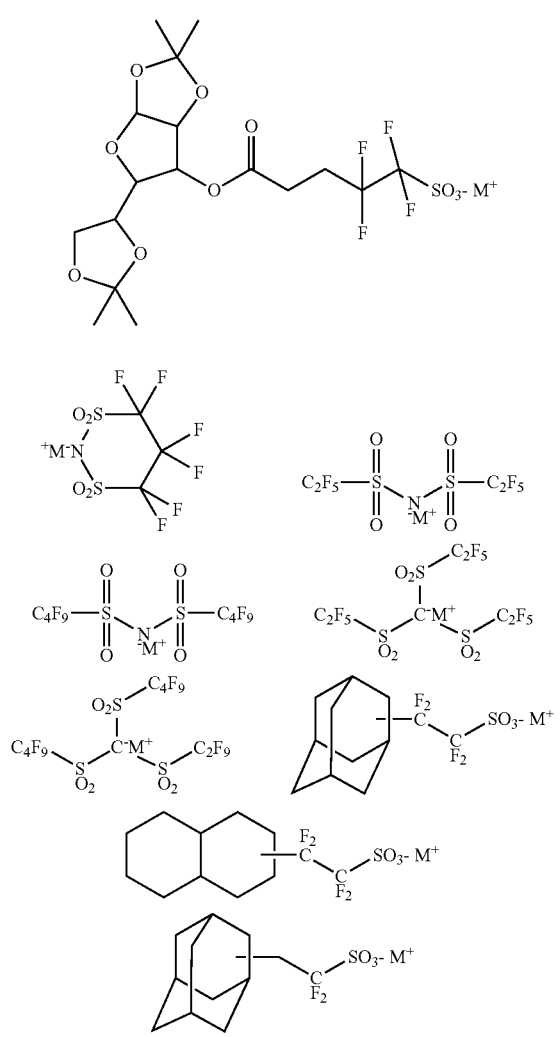

to C5 alkyl with optional fluorine substitution or phenyl, preferably, at least one of $R_5$, $R_6$ and $R_7$ is a non-aromatic group; and

(IV)

wherein: $R_8$ and $R_9$ are independently chosen from hydrogen and organic groups such as alkyl and aryl, preferably C1 to C5 alkyl with optional fluorine substitution or phenyl, preferably, at least one of $R_8$ and $R_9$ is a non-aromatic group.

The trimming compositions further include a solvent or solvent mixture. Suitable solvent materials to formulate and cast the trimming compositions exhibit excellent solubility characteristics with respect to the non-solvent components of the trimming composition, but do not appreciably dissolve the underlying photoresist pattern so as to minimize intermixing. The solvent is typically chosen from water, organic solvents and mixtures thereof. Suitable organic solvents for the overcoat composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; and mixtures containing one or more of these solvents. Of these organic solvents, alcohols, aliphatic hydrocarbons and ethers are preferred. The solvent component of the trimming composition is typically present in an amount of from 90 to 99 wt % based on the trimming composition.

The trimming compositions may include optional additives. For example, to allow for development with an organic solvent developer, the trimming composition can include an additional component that reacts with the surface region of the resist pattern, rendering it soluble in the organic solvent developer. This component preferably contains functional groups chosen from —OH, —NH, —SH, ketones, aldehydes, —SiX wherein X is a halogen, vinyl ethers and combinations thereof. Such a component is particularly useful for negative tone development (NTD) processes. The component diffuses into the surface region of the NTD photoresist and reacts with carboxylic acid groups at the resist surface. This reaction results in a polarity change of the surface, rendering the surface soluble in the organic solvent developer, for example, 2-heptanone or n-butyl acetate. Such component if used is typically present in an amount of from 0.1 to 10 wt % based on total solids of the trimming composition.

The trimming composition can further include a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable nonionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the trimming composition.

The trimming compositions are free of cross-linking agents as such materials can result in a dimensional increase of the resist pattern. Typically, the trimming compositions are free of basic quenchers and base generators, for example, thermal base generator compounds, as such compounds may neutralize the effects of the thermal acid generator component in the trimming compositions. However, it may be useful to include a basic material such as an amine or amide in certain instances, for example, when using an onium salt TAG. In such case, the basic material may be useful for adjusting the thermal acid generation temperature.

The photoresist trimming compositions can be prepared following known procedures. For example, the compositions can be prepared by dissolving solid components of the composition in the solvent components. The desired total solids content of the compositions will depend on factors such as the desired final layer thickness. Preferably, the solids content of the trimming compositions is from 1 to 10 wt %, more preferably from 1 to 5 wt %, based on the total weight of the composition.

Photoresist Pattern Trimming Methods

Processes in accordance with the invention will now be described with reference to FIG. 1A-I, which illustrates an exemplary process flow for forming a photolithographic pattern using a photoresist pattern trimming technique. While the illustrated process flow is of a positive tone development process for forming the resist pattern, the invention is also applicable to a pattern formed by negative tone development (NTD).

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer 106 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer 103 which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist layer 106 formed from a chemically amplified photosensitive composition comprising a matrix polymer having acid labile groups is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 106 is from about 500 to 3000 Å.

The photoresist layer 106 can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 106 is next exposed to activating radiation 108 through a first photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 112, 114 corresponding to regions of the resist layer to be exposed and unexposed, respectively, by the activating radiation. The exposure wavelength is typically sub-400 nm, sub-300 nm or sub-200 nm such as 193 nm or EUV wavelengths, with 248 nm and 193 nm being typical. The exposure energy is typically from about 10 to 80 mJ/cm$^2$, dependent upon the exposure tool and the components of the photosensitive composition.

Following exposure of the photoresist layer 106, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed.

The photoresist layer is next developed to remove exposed regions of the photoresist layer 106, leaving unexposed regions forming a resist pattern 106' having a plurality of features as shown in FIG. 1B. The features are not limited and can include, for example, a plurality of lines and/or cylindrical posts which will allow for the formation of line and/or contact hole patterns in the underlying layers to be patterned. The developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH). In the case of a negative tone development process, where unexposed regions of the photoresist layer are removed and exposed regions remain to form the pattern, an organic solvent developer is employed. The organic developer can, for example, be a solvent chosen from ketones, esters, ethers, hydrocarbons, and mixtures thereof. Of these, 2-heptanone and n-butyl acetate are typical.

It is typical that the resist pattern, for example, the plurality of lines and/or posts have a duty ratio of 1:2 or more, 1:1.5 or more or 1:1 or more before trimming. In the case of lines and posts, duty ratio is defined as the ratio of linewidth or post diameter (L) to the space length (S) between adjacent lines or posts, respectively (i.e., L:S). A higher duty ratio refers to a higher density of lines or posts, while a lower duty ratio refers to a lower density of (i.e., more isolated) lines or posts. With reference to FIG. 1B, the duty ratio prior to trimming is $L_1:S_1$.

A layer 116 of a photoresist pattern trimming composition as described herein is formed over the photoresist pattern 106' as shown in FIG. 1C. The trimming composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. A typical thickness for the pattern trimming layer 116 is from 200 to 1500 Å.

As shown in FIG. 1D, the substrate is next baked to remove solvent in the trimming layer, to cause acid generation by the TAG, to diffuse the generated acid into the surface of the underlying resist pattern 106' and to allow the polarity-changing reaction in the resist pattern surface region 118. The bake can be conducted on a hotplate or in an oven 120, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

The photoresist pattern is next contacted with a developing solution to remove the trimming composition layer 116 and the surface region of the photoresist pattern 118, with the resulting trimmed pattern being shown in FIG. 1E. The developer is typically an aqueous alkaline developer, for example, a quaternary ammonium hydroxide solution, for example, a tetra-alkyl ammonium hydroxide solutions such as 0.26 Normality (N) (2.38 wt %) tetramethylammonium hydroxide (TMAH). Alternatively, an organic solvent developer can be used, for example, a solvent chosen from ketones, esters, ethers, hydrocarbons, and mixtures thereof. Of the organic solvent developers, 2-heptanone and n-butyl acetate are typical.

The duty ratio of the resist pattern after trimming ($L_2:S_2$) is typically 1:2 or less, 1:3 or less or 1:4 or less. In the case of a double patterning process, a typical duty ratio is about 1:1 before trimming and about 1:3 after trimming.

A spacer layer is next formed over the trimmed photoresist pattern and the upper surface of the substrate using known techniques. The spacer layer is typically formed of a material chosen from silicon nitrides, silicon oxides and silicon oxynitrides. Such materials can be deposited by various techniques, with chemical vapor deposition (CVD) such as plasma enhanced CVD being typical. This is followed by etching to remove all spacer layer material on horizontal surfaces of the lines and spaces, leaving behind spacers 120 on sidewalls of the photoresist pattern, as shown in FIG. 1F.

The first photoresist pattern 106" is next removed, leaving behind spacers 120, as shown in FIG. 1G. Because the spacers are typically formed on all side surfaces of the first resist pattern with the resist pattern at the center, they generally result in a closed-ring structure. Therefore, in the case of fabricating a line pattern using the spacer, a trimming process may be performed to remove ends of the patterns to separate the spacer into a discrete line pattern. The trimming process can be conducted, for example, using known etching techniques.

The BARC layer 104, if present, is selectively etched using the spacers 120 as an etch mask, exposing the underlying hardmask layer 103. The hardmask layer is next selectively etched, again using the spacers 120 as an etch mask, resulting in patterned BARC and hardmask layers 104', 103', as shown in FIG. 1H. Suitable etching techniques and chemistries for etching the BARC layer and hardmask layer are known in the art and will depend, for example, on the particular materials of these layers. Dry-etching processes such as reactive ion etching are typical. The spacers 120 and patterned BARC layer 104' are next removed from the substrate using known techniques.

Using the hardmask pattern 103' as an etch mask, the one or more layers 102 are selectively etched. Suitable etching techniques and chemistries for etching the underlying layers 102 are known in the art, with dry-etching processes such as reactive ion etching being typical. The patterned hardmask layer can next be removed from the substrate surface using known techniques, for example, a dry-etching process such as reactive ion etching. The resulting structure is a pattern of etched features, for example, line and/or contact hole patterns. In an alternative exemplary method, it may be desirable to pattern the layers 102 directly without the use of a hardmask layer. Whether direct patterning is employed will depend on factors such as the materials involved, resist selectivity, resist pattern thickness and pattern dimensions.

The following non-limiting examples are illustrative of the invention.

EXAMPLES

Photoresist Compositions

Photoresist A: A positive chemically amplified photoresist composition was prepared by combining: 1.35 g Polymer A (M1/M2/M3=4/4/2 mole ratio, Mw=10K) and 1.35 g Polymer B (M1/M2/M3/M4=30/35/15/20, Mw=6K), wherein the monomer units M1-M4 are as follows:

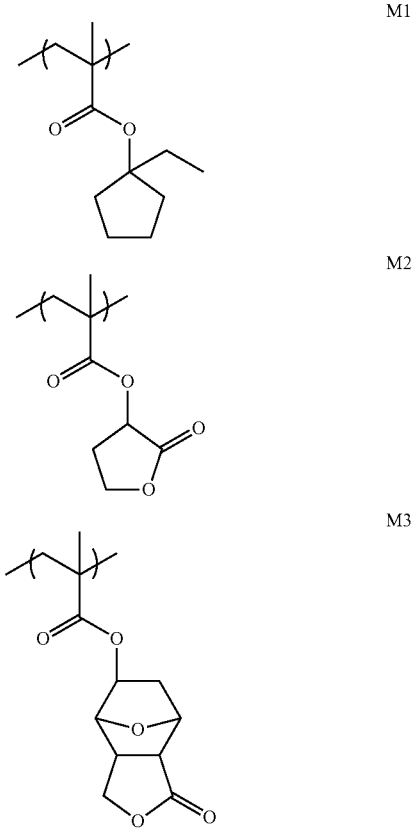

-continued

M4

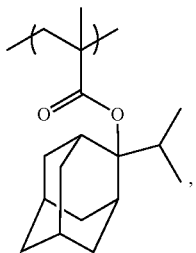

0.51 g tri-phenyl sulfonium 4-(3-hydroxy-adamantane-1-carbonyloxy)-1,1,2,2-tetrafluorobutane sulfonate (TPS-ADOH-TFBS) photoacid generator, 0.07 g trihydroxymethyl-carbamic acid tert-butyl ester base quencher, 0.001 g POLYFOX™ 656 surfactant, 19.34 g propylene glycol methyl ether acetate and 77.36 g methyl-2-hydroxy-iso-butyrate.

Photoresist Trimming Compositions

Example 1

PTC 1

2.813 g copolymer of t-butyl acrylate/methacrylic acid (7/3 of mole ratio), 0.087 g of TAG 1, 19.420 g decane and 77.680 g 2-methyl-1-butynol were mixed until all components were dissolved. The resulting mixture was filtered with a 0.2 micron Nylon filter.

TAG 1

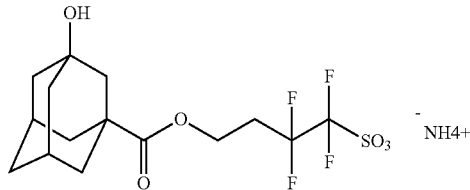

TAG 2

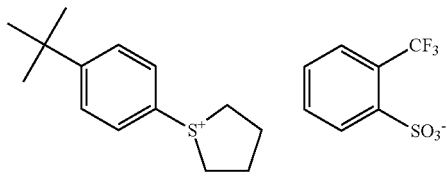

Example 2

PTC 2

2.610 g of copolymer of t-butyl acrylate/methacrylic acid (7/3 of mole ratio), 0.290 g of TAG 2, 24.275 g decane and 72.825 g 2-methyl-1-butynol were mixed until all components were dissolved. The resulting mixture was filtered with a 0.2 micron Nylon filter.

Lithographic Processing

Example 3

Photoresist A was spin-coated on an organic bottom anti-reflective coating (BARC AR™124 23 nm/AR™26N 77 nm (Rohm and Haas Electronic Materials LLC)) over 12 inch silicon wafers and softbaked (SB) at 95° C. for 60 seconds, to a thickness of 700 Å. Opticoat™ OC2000 topcoat material (Rohm and Haas Electronic Materials LLC) was coated on the resist to form an immersion topcoat layer. The coated wafers were exposed with an ASML ArF 1900i immersion scanner with NA=1.35, Dipole 35Y illumination (0.9/0.635sigma), plus x polarization, and post-exposure baked (PEB) at 90° C. for 60 seconds. The coated wafers were treated with 0.26N (normal) aqueous tetramethylammonium hydroxide solution to develop the imaged resist layers to form 45 nm 1:1 line and space resist patterns. Linewidth was measured for one of the patterned wafers. A 70 nm thick layer of the trimming composition of Example 1 (PTC 1) or Example 2 (PTC 2) was spin-coated over another of the patterned wafers, baked at the conditions shown in Table 1, and developed in 2.38% TMAH developer for 12 seconds with a TEL Lithus GP nozzle. Linewidth measurements were made, with the results being shown in Table 1. Also measured for PCT 2 samples were effective sensitivity (ES), critical dimension (CD) and depth of focus (DOF), with the results being shown in Table 2. ES is expressed as the amount of exposure at which the line and space patterns reached the target CD after exposure and development.

Example 4 (Comparative)

The procedures of Example 3 were repeated, except no trimming composition was coated over the wafers, and the resist-patterned wafers were developed with 2.38% TMAH for 60 seconds after the trim-bake. Linewidth measurements of the resist patterns were made before the trim-bake and after the trim-bake/development steps, with the results being shown in Table 1.

TABLE 1

| Trim-Bake Conditions | Linewidth Without Trimming | Linewidth Without Trimming; With Trim-Bake/Develop Only (Comp Ex. 4) | Linewidth With Trimming (Ex. 3/PTC 1) | Linewidth With Trimming (Ex. 3/PTC 2) |
|---|---|---|---|---|
| 140° C./60 s | 56 nm | 54 nm | 50 nm | 48 nm |
| 145° C./60 s | 56 nm | 56 nm |  | 44 nm |

TABLE 2

|  | Linewidth Without Trimming | Linewidth With Trimming (Ex. 3/PTC 2 @ 145° C./60 s) |
|---|---|---|
| Es (mJ/cm$^2$) | 67.5 | 39 |
| CD (nm) | 28 | 28 |
| DOF (nm) | 60 | 90 |

The results indicate that the resist trimming compositions of the invention are effective to shrink CDs of photoresist patterns and to enhance depth of focus.

What is claimed is:
1. A method of trimming a photoresist pattern, comprising, in sequence:
(a) providing a semiconductor substrate comprising one or more layers to be patterned on an upper surface thereof;
(b) forming a photoresist pattern on the one or more layers to be patterned, wherein the photoresist pattern comprises a plurality of features and is formed from a chemi- cally amplified photoresist composition, the photoresist pattern comprising a matrix polymer having acid labile groups;

(c) coating a photoresist trimming composition over the photoresist pattern, wherein the trimming composition comprises a matrix polymer, a thermal acid generator and a solvent, and wherein the trimming composition is free of cross-linking agents;

(d) heating the coated semiconductor substrate to generate an acid in the trimming composition from the thermal acid generator, thereby causing a change in polarity of the photoresist matrix polymer in a surface region of the photoresist pattern; and (e) contacting the photoresist pattern with a developing solution to remove the surface region of the photoresist pattern.

2. The method of claim 1, wherein the solvent of the photoresist trimming composition is chosen from water, organic solvents and mixtures thereof.

3. The method of claim 1, wherein the matrix polymer of the photoresist trimming composition is soluble in aqueous alkaline developer.

4. The method of claim 1, wherein the developing solution is an aqueous tetramethylammonium hydroxide solution.

5. The method of claim 1, wherein the matrix polymer of the photoresist trimming composition contains functional groups selected from —OH, —COOH, —SO$_3$H, —SiOH, hydroxyl styrene, hydroxyl naphthalene, sulfonamide, hexafluoroisopropyl alcohol, anhydrate, lactone, ester, ether, allylamine, pyrolidone.

6. The method of claim 1, wherein the trimming composition further comprises a compound comprising functional groups chosen from —OH, —NH, —SH, ketones, aldehydes, —SiX wherein X is chosen from halogens, vinyl ethers and combinations thereof, and combinations thereof.

7. The method of claim 1, wherein the plurality of features of the photoresist pattern comprise a plurality of lines or posts having a duty ratio of 1:1 or more before trimming and 1:3 or less sense after trimming.

8. The method of claim 1, further comprising:

(f) forming sidewall spacers on the trimmed photoresist pattern after contacting the photoresist pattern with the developing solution; and (g) removing the trimmed photoresist pattern, leaving sidewall spacers on the one or more layers to be patterned.

9. The method of claim 1, wherein the acid generated by the thermal acid generator is fluorine-substituted.

10. The method of claim 9, wherein the solvent of the photoresist trimming composition is chosen from alkanes, alcohols, ethers, esters, ketones and mixtures thereof.

11. The method of claim 1, wherein the thermal acid generator generates an aromatic acid.

12. The method of claim 11, wherein the thermal acid generator is chosen from one or more of the following compounds:

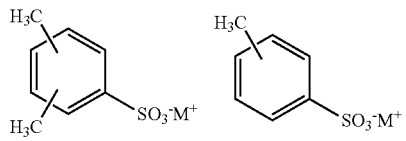

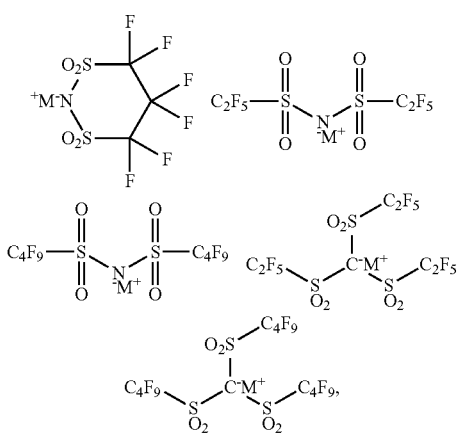

wherein M+ is an organic cation.

13. The method of claim 1, wherein the thermal acid generator generates a non-aromatic acid.

14. The method of claim 13, wherein the thermal acid generator is chosen from one or more of the following thermal acid generators:

wherein M+ is an organic cation.

15. The method of claim 13, wherein the non-aromatic acid has at least one fluorine substituent at the alpha position of the acid group.

16. The method of claim 1, wherein the thermal acid generator generates a sulfonic acid.

17. The method of claim 16, wherein the thermal acid generator is chosen from one or more of: CF$_3$SO$_3$-M+, C$_4$F$_9$SO$_3$-M+, CH$_3$CH$_2$CF$_2$CF$_2$SO$_3$-M+ and HOCH$_2$CH$_2$CF$_2$CF$_2$SO$_3$-M+, wherein M+ is an organic cation.

18. The method of claim 16, wherein the thermal acid generator is chosen from one or more of the following thermal acid generators:

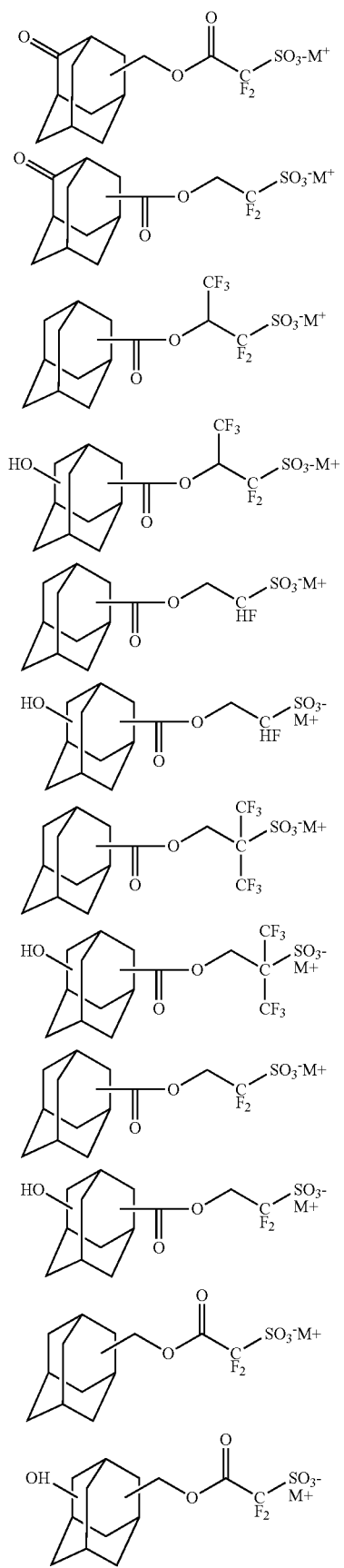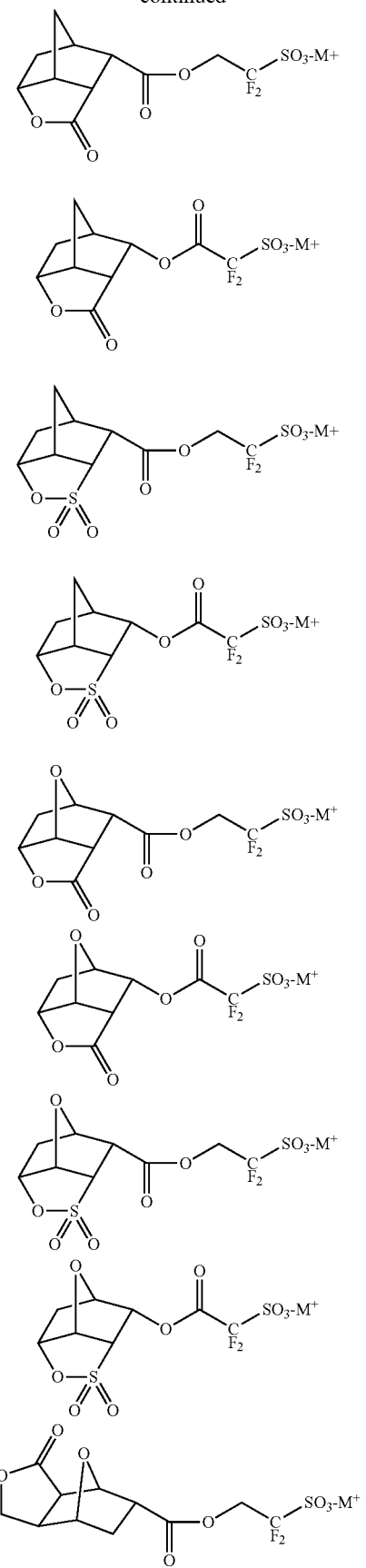

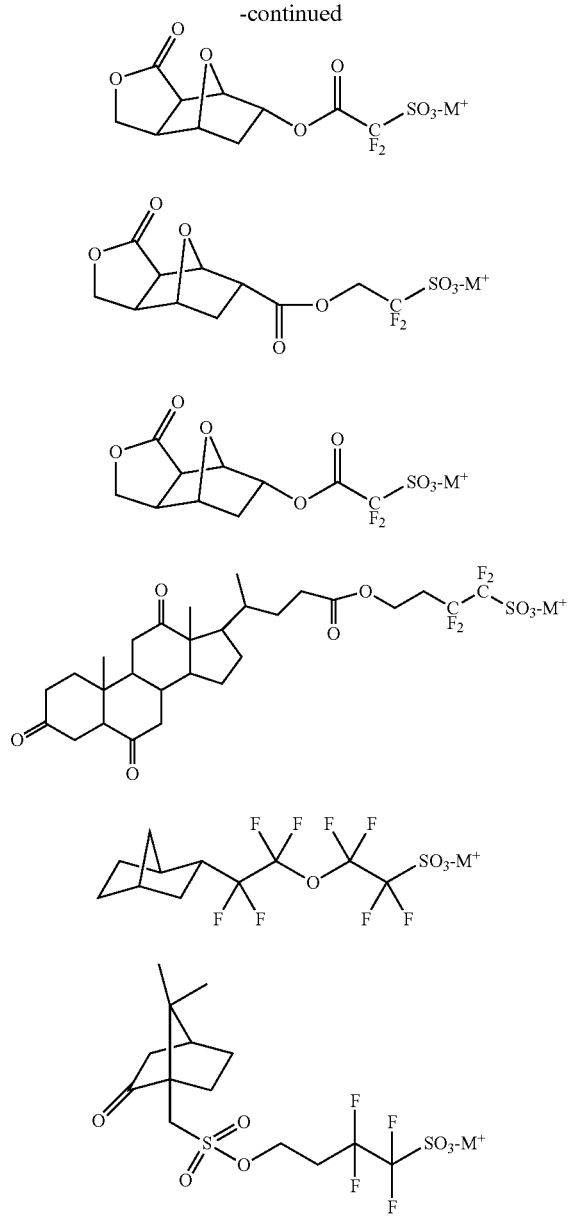
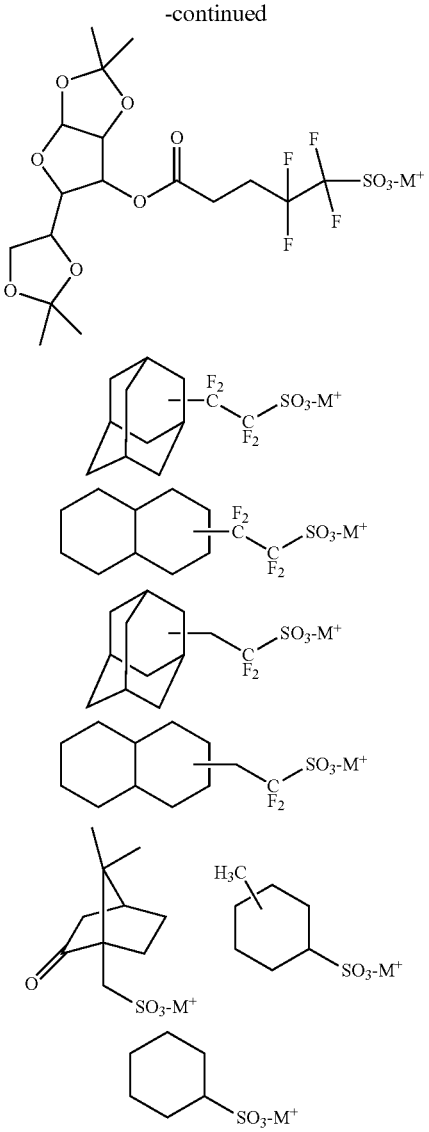
wherein M+ is an organic cation.
* * * * *